United States Patent
Li et al.

(10) Patent No.: US 8,829,543 B2
(45) Date of Patent: Sep. 9, 2014

(54) SEMICONDUCTOR LIGHT EMITTING DEVICE AND FLIP CHIP PACKAGE DEVICE

(71) Applicants: Yun-Li Li, Tainan (TW); Chih-Ling Wu, Tainan (TW); Yi-Ru Huang, Tainan (TW); Yu-Yun Lo, Tainan (TW)

(72) Inventors: Yun-Li Li, Tainan (TW); Chih-Ling Wu, Tainan (TW); Yi-Ru Huang, Tainan (TW); Yu-Yun Lo, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 13/787,765

(22) Filed: Mar. 6, 2013

(65) Prior Publication Data
US 2013/0277641 A1 Oct. 24, 2013

(30) Foreign Application Priority Data

Apr. 20, 2012 (TW) .............................. 101114202 A

(51) Int. Cl.
*H01L 33/00* (2010.01)
*H01L 33/10* (2010.01)
*H01L 33/60* (2010.01)
*H01L 33/06* (2010.01)
*H01L 33/40* (2010.01)
*H01L 33/08* (2010.01)
*H01L 33/20* (2010.01)

(52) U.S. Cl.
CPC ................ *H01L 33/60* (2013.01); *H01L 33/20* (2013.01); *H01L 33/06* (2013.01); *H01L 33/405* (2013.01)
USPC ................. 257/91; 257/95; 257/98; 257/100; 257/E33.006; 257/E33.072; 257/E51.021; 438/29; 438/31; 438/39; 438/116

(58) Field of Classification Search
CPC ......... H01L 33/06; H01L 33/08; H01L 33/20; H01L 33/24; H01L 33/60; H01L 33/105; H01L 33/405
USPC ........... 438/22, 26–27, 29, 31, 34, 39, 40, 41, 438/46–47, 106, 116, 118–120; 257/79, 91, 257/94, 95, 98, 99, 100, 183–183.1, 200, 257/431–437, 678, 680, E51.021, E33.001, 257/E33.005–E33.006, E33.025, E33.028, 257/E33.033–E33.034, E33.056, E33.059, 257/E33.073–E33.074, E33.067
See application file for complete search history.

(56) References Cited

U.S. PATENT DOCUMENTS 6,480,389 B1 * 11/2002 Shie et al. ...................... 361/707
7,413,917 B2 * 8/2008 Gallup et al. ................... 438/27
(Continued)

FOREIGN PATENT DOCUMENTS

TW 200845424 11/2008
TW 201210074 3/2012

OTHER PUBLICATIONS

"Office Action of Taiwan Counterpart Application", issued on Jan. 23, 2014, p. 1-p. 8, in which the listed references were cited.

*Primary Examiner* — Laura Menz
*Assistant Examiner* — Maliheh Malek
(74) *Attorney, Agent, or Firm* — Jianq Chyun IP Office

(57) ABSTRACT

A semiconductor light emitting device including a first type doped semiconductor layer, a light emitting layer, a second type doped semiconductor layer, and a reflection layer is provided. The first type doped semiconductor layer has a mesa portion and a depression portion. The light emitting layer is disposed on the mesa portion and has a first surface, a second surface and a first side surface connecting the first surface with the second surface. The second type doped semiconductor layer is disposed on the light emitting layer and has a third surface, a fourth surface and a second side surface connecting the third surface with the fourth surface. Observing from a viewing direction parallel to the light emitting layer, the reflection layer covers at least part of the first side surface and at least part of the second side surface. A flip chip package device is also provided.

14 Claims, 7 Drawing Sheets

(56) References Cited

U.S. PATENT DOCUMENTS

| | | |
|---|---|---|
| 8,476,644 B2 * | 7/2013 | Illek et al. .................. 257/79 |
| 8,546,178 B2 * | 10/2013 | Morioka et al. ............... 438/96 |
| 2005/0168992 A1 * | 8/2005 | Hirose ......................... 362/296 |
| 2008/0048206 A1 * | 2/2008 | Lee et al. ...................... 257/103 |
| 2008/0185606 A1 * | 8/2008 | Sano et al. .................... 257/98 |
| 2009/0283787 A1 * | 11/2009 | Donofrio et al. ............... 257/98 |
| 2010/0117111 A1 * | 5/2010 | Illek et al. ..................... 257/98 |
| 2011/0108875 A1 * | 5/2011 | Takenaka et al. .............. 257/98 |
| 2011/0127568 A1 * | 6/2011 | Donofrio et al. ............... 257/99 |
| 2012/0241760 A1 * | 9/2012 | Okabe ........................... 257/76 |
| 2013/0020596 A1 * | 1/2013 | Kim .............................. 257/95 |
| 2014/0021441 A1 * | 1/2014 | Katsuno et al. ................ 257/13 |

* cited by examiner

SEMICONDUCTOR LIGHT EMITTING DEVICE AND FLIP CHIP PACKAGE DEVICE

CROSS-REFERENCE TO RELATED APPLICATION

This application claims the priority benefit of Taiwan application serial no. 101114202, filed on Apr. 20, 2012. The entirety of the above-mentioned patent application is hereby incorporated by reference herein and made a part of this specification.

BACKGROUND

1. Field of the Invention

The invention relates to a semiconductor light emitting device and a flip chip package device.

2. Description of Related Art

Light-emitting diode (LED), in comparison to conventional incandescent lamp and fluorescent lamp, has absolute advantages in environmental protection, electro-optical conversion efficiency and service life, but there still exists problems in lighting popularization and application, such as light emitting efficiency and production costs.

Light emitting efficiency of the light-emitting diode (LED) is commonly referred as external quantum efficiency of an element, which is a product of internal quantum efficiency of the element and light extraction efficiency of the element. The so-called internal quantum efficiency of the element is in fact the electro-optical conversion efficiency of the element itself, and is mainly related to the characteristics of the elements, such as energy bands, defects, and impurities of the material of the element and epitaxial composition and structure of the element. In homojunction structure, for example, probability of having an electron meeting and combining with an electron hole (producing light) is very low, viz., very low light emitting efficiency. Light extraction efficiency of the element is a number of photons at the external of the element capable of actually being detected after photons generated in the internal of the element have gone through absorption, refraction and reflection of the element itself.

Generally, internal quantum efficiency of the high quality light-emitting diode may reach 90% or more; however, when photons generated by an active layer (light emitting layer) reach a chip and air interface and have an incident angle greater than a critical angle, a total internal reflection (TIR) is to occur. In the other word, only photons smaller than the critical angle may be emitted out, while the rest of photons is reflected back into the chip. Photons inside the light-emitting diode chip, after went through multiple reflections, are finally absorbed by the materials, thus causing the loss in light extraction efficiency, thereby influencing external quantum efficiency and becoming the biggest stumbling block for enhancing the light emitting efficiency of light emitting diode.

SUMMARY OF THE INVENTION

The invention provides a semiconductor light emitting device with favorable light emitting efficiency.

The invention provides a flip chip package device with favorable light emitting efficiency.

According to an exemplary embodiment of the invention, a semiconductor light emitting device including a first type doped semiconductor layer, a light emitting layer, a second type doped semiconductor layer, and a reflection layer is provided. The first type doped semiconductor layer has a mesa portion and a depression portion, wherein the thickness of the mesa portion is greater than the thickness of the depression portion. The light emitting layer is disposed on the mesa portion and has a first surface, a second surface opposite to the first surface and a first side surface connecting the first surface with the second surface, wherein the first surface faces towards the first type doped semiconductor layer and the second surface faces away from the first type doped semiconductor layer. The second type doped semiconductor layer is disposed on the light emitting layer, and the second type doped semiconductor layer has a third surface, a fourth surface opposite to the third surface and a second side surface connecting the third surface with the fourth surface, wherein the third surface faces towards the light emitting layer and the fourth surface faces away from the light emitting layer. The reflection layer covers at least part of the second type doped semiconductor layer and at least part of the first type doped semiconductor layer, wherein observing from a viewing direction parallel to the light emitting layer, the reflection layer covers at least part of the first side surface and at least part of the second side surface. In addition, the reflectance of the reflection layer is greater than 98%.

According to an exemplary embodiment of the invention, a semiconductor light emitting device including a first type doped semiconductor layer, a second type doped semiconductor layer, a first reflection layer, a light emitting layer, and a second reflection layer is provided. The first type doped semiconductor layer has a mesa portion and a depression portion, wherein the thickness of the mesa portion is greater than the thickness of the depression portion. The second type doped semiconductor layer is disposed on the mesa portion. The light emitting layer is disposed between the first type doped semiconductor layer and the second type doped semiconductor layer. The first reflection layer is disposed on the second type doped semiconductor layer. The second reflection layer is disposed on the first reflection layer and covers at least part of the first reflection layer, wherein the reflectance of the second reflection layer is greater than 98%. When observing along the viewing direction perpendicular to the light emitting layer, at least part of the second reflection layer and the first reflection layer do not overlap.

In an exemplary embodiment of the invention, a flip chip package device including the aforementioned semiconductor light emitting device and a circuit substrate is provided. The semiconductor light emitting device is flipped over on and electrically connected with the circuit substrate.

According to the above, the semiconductor light emitting device and the flip chip package device according to the embodiments of the invention have a first reflection layer and a second reflection layer. When observing from the viewing direction perpendicular to the light emitting layer, at least part of the second reflection layer and the first reflection layer do not overlap. Consequently, the light emitted from the light emitting layer and not reflected by the first reflection layer may be reflected by the second reflection layer, so as to enhance the utilization of light emitted from the light emitting layer. In addition, in the semiconductor light emitting device according to the embodiments of the invention, since the reflection layer covers at least part of the second type doped semiconductor layer and at least part of the first type doped semiconductor layer, and when observing from the viewing direction parallel to the light emitting layer, the reflection layer covers at least part of the first side surface and at least part of the second side surface; therefore, the reflection layer may reflect the light emitted from the light emitting layer, so as to enhance the utilization of the light emitted from the light emitting layer.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
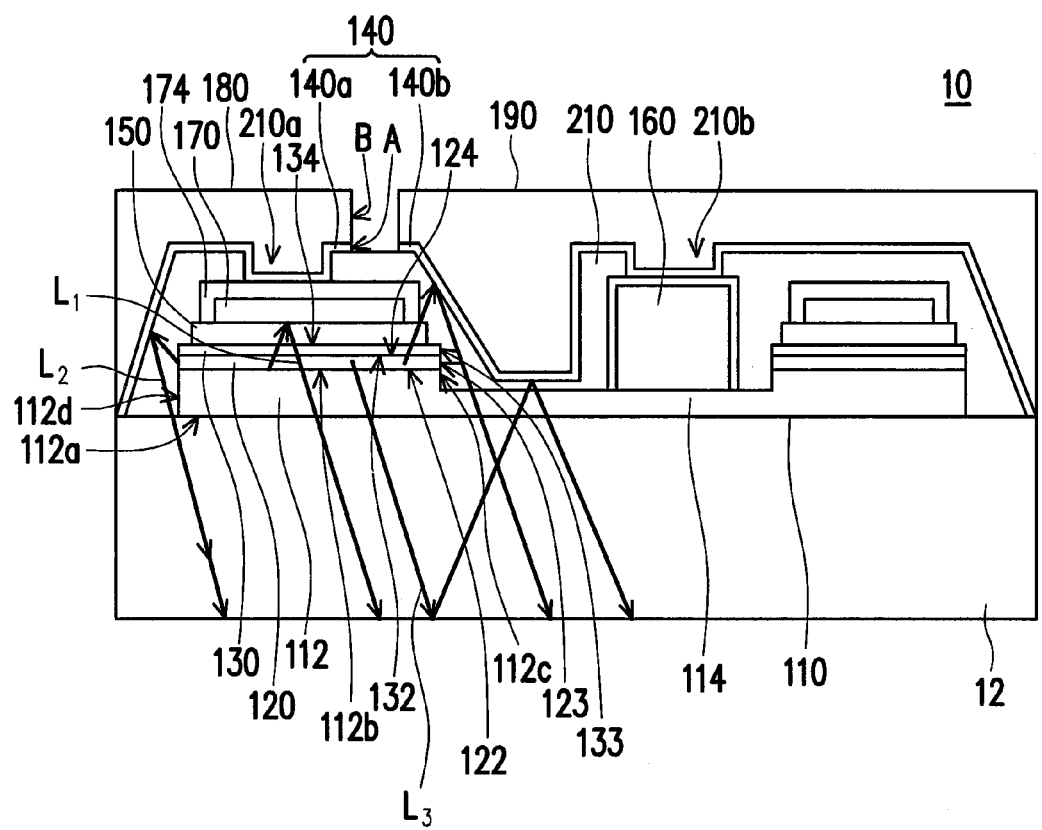
FIG. 1A is a cross-sectional view of a semiconductor light emitting device in accordance of an exemplary embodiment.

FIG. 1A is a cross-sectional view of a semiconductor light emitting device in accordance of an exemplary embodiment. Referring to FIG. 1A, the semiconductor light emitting device 10 in this embodiment includes a first type doped semiconductor layer 110, a light emitting layer 120, a second type doped semiconductor layer 130, and a reflection layer 140. The first type doped semiconductor layer 110 has a mesa portion 112 and a depression portion 114, wherein the thickness of the mesa portion 112 is greater than the thickness of the depression portion 114. The light emitting layer 120 is disposed on the mesa portion 112 and has a surface 122, a surface 124 opposite to the surface 122 and a side surface 123 connecting the surface 122 and the surface 124, wherein the surface 122 faces towards the first type doped semiconductor layer 110, and the surface 124 faces away from the first type doped semiconductor layer 110.

The second type doped semiconductor layer 130 is disposed on the light emitting layer 120, and the second type doped semiconductor layer 130 has a surface 132, a surface 134 opposite to the surface 132 and a side surface 133 connecting the surface 132 and the surface 134, wherein the surface 132 faces towards the light emitting layer 120, and the surface 134 faces away from the light emitting layer 120. The reflection layer 140 covers at least part of the second type doped semiconductor layer 130 and at least part of the first type doped semiconductor layer 110.

In the exemplary embodiment, the semiconductor light emitting device 10 may be formed on a light transmissive substrate 12, and a material of the light transmissive substrate 12 is, for example, sapphire, gallium nitride or other suitable light transmissive materials. In the exemplary embodiment, the first type doped semiconductor layer 110 is, for example, an n-type gallium nitride (n-GaN) layer, and the second type doped semiconductor layer 130 is, for example, a p-type gallium nitride (p-GaN) layer. The light emitting layer 120 may be a quantum well layer or multiple quantum well (MQW) layers, such as a multiple quantum well structure of alternatively stacked gallium nitride (GaN) layers and indium gallium nitride (InGaN) layers. However, in other exemplary embodiments, the first type doped semiconductor layer 110 may be a p-type gallium nitride layer, and the second type doped semiconductor layer 130 is an n-type gallium nitride layer.

In addition, referring to FIG. 1A, the semiconductor light emitting device 10 in this embodiment may further include an ohmic contact layer 150 disposed on the second type doped semiconductor layer 130. A material of the ohmic contact layer 150 is, for example, indium tin oxide (ITO), indium zinc oxide (IZO), nickel gold alloy (Ni/Au), aluminium zinc oxide (AZO), zinc oxide (ZnO), indium tin zinc oxide (ITZO), or other suitable conductive materials. A depression portion 114 of the first type doped semiconductor layer 110 also further includes a electrode 160, and a material of the electrode 160 is, for example, titanium, aluminium, chromium, gold, nickel, indium, tin, zinc, copper, tungsten, platinum, palladium, other conductive materials, or the combinations thereof, but the invention is not limited thereto. In the exemplary embodiment, a reflection layer 170 may be further disposed on the ohmic contact layer 150, wherein the reflection layer 170 may made of high-reflective metal such as aluminium, silver, or the combination thereof. The reflection layer 170, other than conductive function, may further reflect light emitted from the light emitting layer 120 towards the first type doped semiconductor layer 110.

Figure 1B:
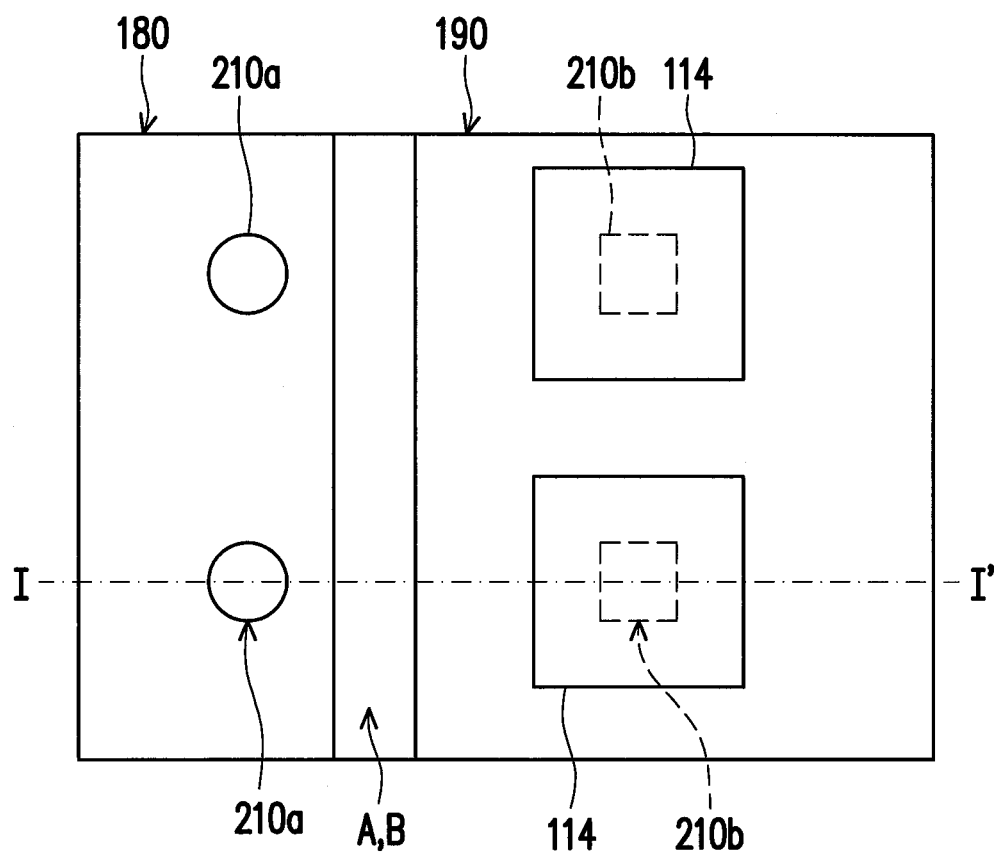
FIG. 1B is a top view of the semiconductor light emitting device in FIG. 1A in accordance with the exemplary embodiment.

FIG. 1B is a top view of the semiconductor light emitting device 10 in FIG. 1A in accordance with the exemplary embodiment, and FIG. 1A is a cross-sectional view cut along a line I-I' in FIG. 1B. A rectangular region of solid line 114 in FIG. 1B represents the depression portion 114 in the exemplary embodiment illustrated in FIG. 1A. After the first type doped semiconductor layer 110, the light emitting layer 120 and the second type doped semiconductor layer 130 are formed on the light transmissive substrate 12, a part of the region is etched in deep into the first type doped semiconductor layer 110, thus forming the first type doped semiconductor layer 110 having a mesa portion 112 and a depression portion 114, and the thickness of the mesa portion 112 is greater than the thickness of the depression portion 114. In addition, according to design requirement, as shown in FIG. 1B, there may be more than one or just one depression portion 114.

Referring to FIG. 1A, in the exemplary embodiment, the semiconductor light emitting device 10 further includes a first metal contact 180 and a second metal contact 190. The first metal contact 180 and the second metal contact 190 are both disposed on the reflection layer 140 and respectively electrically connected to the second type doped semiconductor layer 130 and the first type doped semiconductor layer 110.

Referring to FIG. 1A and FIG. 1B, in more detail, the reflection layer 140 of the semiconductor light emitting device 10 in this embodiment is a patterned metal reflection layer, and a material of the patterned reflection layer is, for example, gold, aluminium, silver, or other materials with high reflectance. In the exemplary embodiment, the reflection layer 140 further includes a first metal reflective portion 140a and a second metal reflective portion 140b respectively electrically connected to the second type doped semiconductor layer 130 and the first type doped semiconductor layer 110, wherein the first metal reflective portion 140a and the second metal reflective portion 140b are separately disposed from each other. Specifically, in the exemplary embodiment, the reflection layer 140 has a spacing A, the spacing A separates the first metal reflective portion 140a and the second metal reflective portion 140b from each other. Moreover, a spacing B is also between the first metal contact 180 and the second metal contact 190, and the spacing B corresponds to the spacing A, wherein the spacing B separates the first metal contact 180 and the second metal contact 190 from each other.

In the exemplary embodiment, when observing along a viewing direction perpendicular to the light emitting layer 120, at least part of the reflection layer 140 and the reflection layer 170 do not overlap. In addition, when observing from a viewing direction parallel to the light emitting layer 120, the reflection layer 140 covers at least part of the side surface 123 and at least part of the side surface 133. In the other word, in the exemplary embodiment, the reflection layer 140 is essentially distributed along the up and down shapes of the mesa portion 112 and the depression portion 114. Referring to FIG. 1A, wherein the reflection layer 140 is distributed from above the mesa portion 112, obliquely extended downwards to nearing the depression portion 114, and then extended downwards to a horizontal position lower than the light emitting layer 120 or extended downwards to a horizontal position at the same height with the surface 122.

For instance, when located at the depression portion 114, then parallel to the light emitting layer 120 and observing from a connection direction along the line I-I' in FIG. 1B, the reflection layer 140 covers the side surface 123 of the light emitting layer 120. In addition, in the exemplary embodiment, the mesa portion 112 has a surface 112a, a surface 112b, a side surface 112c, and a side surface 112d. The surface 112a faces away from the light emitting layer 120. The surface 112b is opposite to the surface 112a and faces towards the light emitting layer 120. The side surface 112c connects the surface 112b with the depression portion 114. The side surface 112d connects the surface 112a and the surface 112b, wherein when observing from a viewing direction parallel to the light emitting layer 120, the reflection layer 140 covers at least part of the side surface 112c, and covers at least part of the side surface 112d. In the other word, when observing from a direction along the line I-I' in FIG. 1B, the reflection layer 140 covers at least part of the side surface 112d, at least part of the side surface 123, and at least part of the side surface 112c.

Figure 1C:
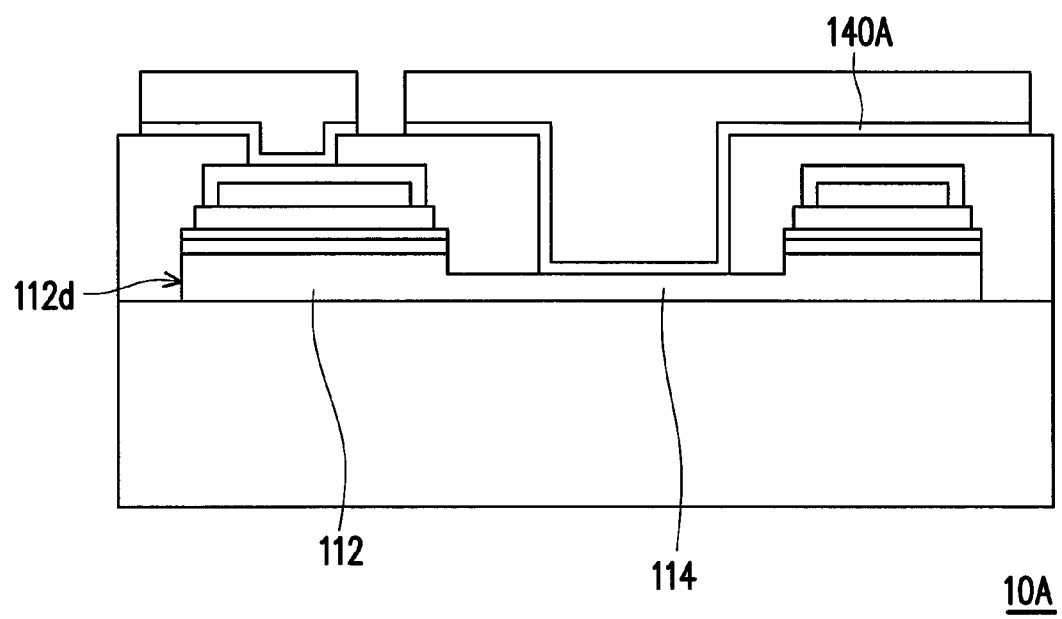
FIG. 1C illustrates a cross-sectional view of a semiconductor light emitting device in accordance with another exemplary embodiment.

However, the invention is not limited to the embodiments described in the aforementioned paragraph, FIG. 1C illustrates a cross-sectional view of a semiconductor light emitting device in accordance with another exemplary embodiment. In the semiconductor light emitting device 10A, the reflection layer 140A is distributed from above the mesa portion 112 and then extended along a direction more perpendicular to the depression portion 114 to near to the depression portion 114, and when observing from a viewing direction parallel to the light emitting layer 120, the reflection layer 140A is not extended to cover the side surface 112d of the mesa portion 112.

Continuously referring to FIG. 1A, in the exemplary embodiment, the semiconductor light emitting device 10 further includes a patterned insulating layer 210 disposed between the first metal reflective portion 140a and the first type doped semiconductor layer 110, and also disposed between the second metal reflective portion 140b and the depression portion 114 of the first type doped semiconductor layer 110, wherein the patterned insulating layer 210 has at least one first opening 210a and at least one second opening 210b. The first metal reflective portion 140a penetrates the first opening 210a and electrically connects with the second type doped semiconductor layer 130, and the second metal reflective portion 140b penetrates the second opening 210b and electrically connects with the first type doped semiconductor layer 110. The patterned insulating layer 210 may be made of one of silicon dioxide, titanium dioxide, zinc oxide, niobium oxide, tantalum oxide, oxides of aluminium oxide, indium oxide, magnesium oxide, tin oxide, and the above combination of choice, or one of silicon nitride, titanium nitride, zinc nitride, niobium nitride, tantalum nitride, aluminium nitride, indium nitride, magnesium nitride, tin nitride, any nitrides combination thereof, or other suitable insulating materials. With reference to FIG. 1B, a circular region of solid line represents the first opening 210a in FIG. 1A and a rectangular region of dotted line represents the second opening 210b. In the exemplary embodiment, the first metal contact 180 and the first metal reflective portion 140a both penetrate the first opening 210a and electrically connect with the second type doped semiconductor layer 130; additionally, the second metal contact 190 and the second metal reflective portion 140b both penetrate the second opening 210b and electrically connect with the first type doped semiconductor layer 110. In addition, as shown in FIG. 1B, the number of the first opening 210a and the second opening 210b may be more than one depending on the design requirement.

Referring to FIG. 1A, in the exemplary embodiment, the first metal contact 180 penetrates the first opening 210a and electrically connects with the second type doped semiconductor layer 130. In the exemplary embodiment, the first metal contact 180 may electrically connect with the second type doped semiconductor layer 130 through the reflection layer 170 and the ohmic contact layer 150. In order to suppress the metal atoms in the first metal contact 180 to spread to the reflection layer 170, or suppress the metal atoms of the reflection layer 170 to spread to the first metal contact 180, a barrier layer 174 may be disposed between the reflection layer 170 and the first metal contact 180. A material of the barrier layer 174 may be titanium, tungsten or other suitable materials.

Referring to FIG. 1A, in the exemplary embodiment, the reflection layer 170 and the reflection layer 140 form a good reflection system, wherein a reflectance of the reflection layer 140 may be greater than 98%. When light is emitted from various directions of the light emitting layer 120, light $L_1$ incident on the reflection layer 170 is reflected to the light transmissive substrate 12, and light $L_2$ emitted from the side surface 123 of the light emitting layer 120 and not reflected by the reflection layer 170 may be reflected back to the light transmissive substrate 12 by the reflection layer 140. In addition, light $L_3$ totally reflected by part of the light transmissive substrate 12 may again be reflected back to the light transmissive substrate 12 by the reflection layer 140 and the reflection layer 170. Since the disposition of the reflection layer 140 enables light not reflected by the reflection layer 170 to return to the light transmissive substrate 12, the overall semiconductor light emitting device 10 has higher light utilization efficiency. In the other word, the reflection layer 170 can reflect light that enters within a certain solid angle, and the reflection layer 140 expends the range of the reflection enabling sold angle to the entire hemisphere; therefore, light (e.g., $L_2$) emitted from various angles of the light emitting layer 120 and not reflected by the reflection layer 170 may still return to the light transmissive substrate 12 through the reflection layer 140, which covers the entire hemisphere.

Figure 2:
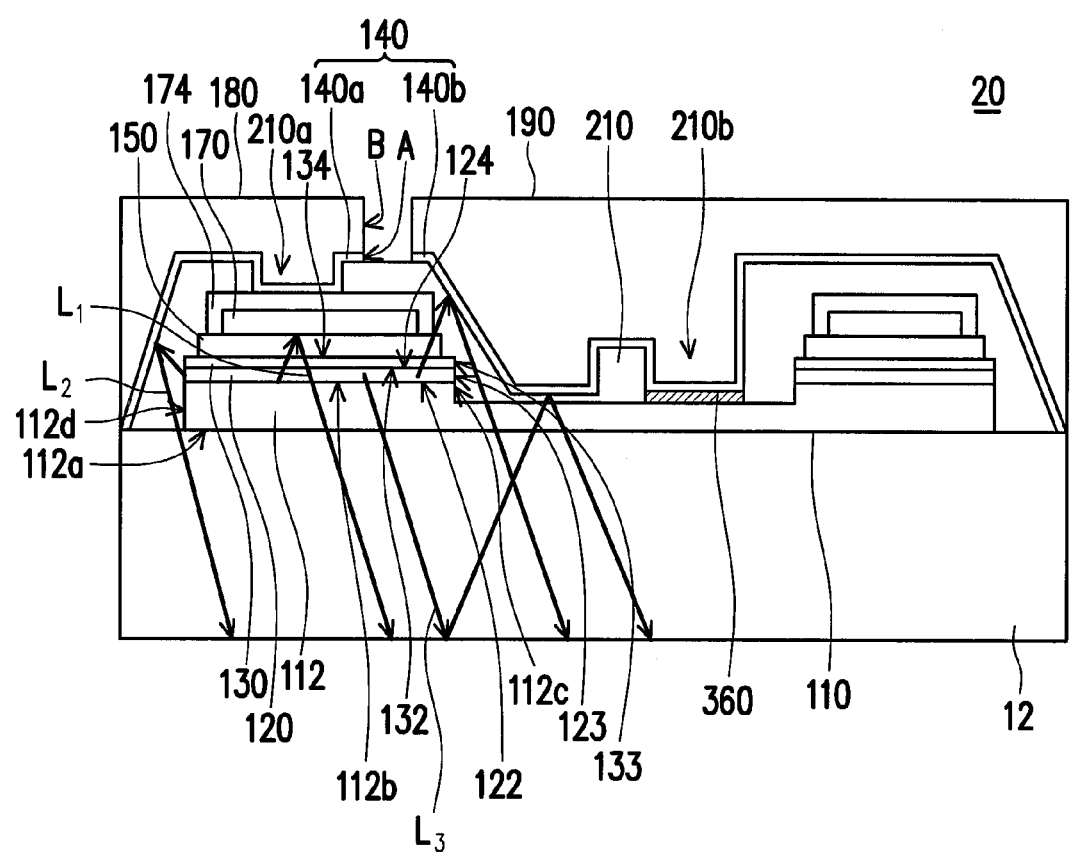
FIG. 2 is cross-sectional view of a semiconductor light emitting device in accordance with an exemplary embodiment.

FIG. 2 is cross-sectional view of a semiconductor light emitting device in accordance with an exemplary embodiment. The semiconductor light emitting device 20 of FIG. 2 is similar to the semiconductor light emitting device 10 of FIG. 1A, except for the main difference that the depression portion 114 of the first type doped semiconductor layer 110 in FIG. 1A includes an electrode 160, and in the semiconductor light emitting device 20 of FIG. 2, the electrode may be replaced with an ohmic contact layer 360, wherein a material of the ohmic contact layer 360 may be selected from a combination within a group of titanium, aluminium, gold, nickel, indium, tin, zinc, chromium, copper, tungsten, platinum, palladium, indium tin oxide, indium oxide, tin oxide, and aluminum zinc oxide. In the exemplary embodiment, since the semiconductor light emitting device 20 of FIG. 2 is similar to the exemplary embodiment of FIG. 1A, a top view of the semiconductor light emitting device 20 is specifically the same as shown in FIG. 1B. In the exemplary embodiment, since other structures and figures are similar to the exemplary embodiment of FIG. 1A, detailed descriptions are not repeated herein.

Figure 3:
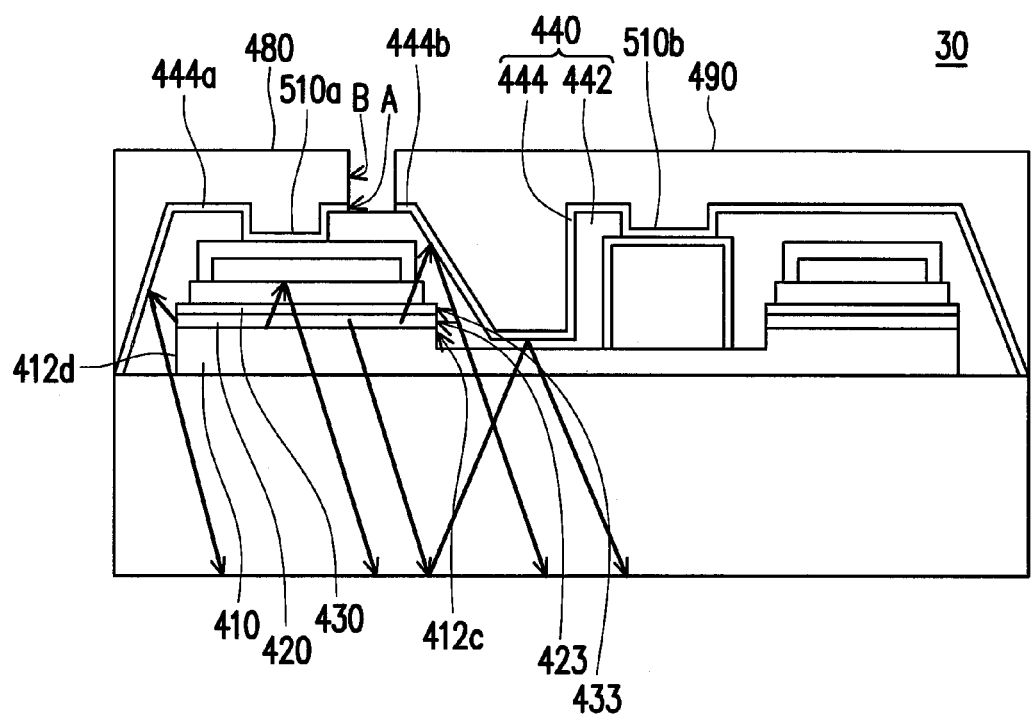
FIG. 3 is a cross-sectional view of a semiconductor light emitting device in accordance with an alternative exemplary embodiment.

FIG. 3 is a cross-sectional view of a semiconductor light emitting device in accordance with an alternative exemplary embodiment. The semiconductor light emitting device 30 of FIG. 3 is similar to the semiconductor light emitting device 10 of FIG. 1A, except for the main difference that, in the semiconductor light emitting device 10 of FIG. 1A, the patterned insulating layer 210 disposed between the first metal reflective portion 140a and the first type doped semiconductor layer 110, and also disposed between the second metal reflective portion 140b and the depression portion 114 of the first type doped semiconductor layer 110, is replaced with a distributed Bragg sub-reflection layer 442, in the exemplary embodiment. Therefore in the exemplary embodiment, a reflection layer 440 includes a patterned distributed Bragg sub-reflection layer 442 and a patterned metal sub-reflection layer 444, and the patterned sub-reflection layer 444 is disposed on the patterned distributed Bragg sub-reflection layer 442.

In the exemplary embodiment, the patterned distributed Bragg sub-reflection layer 442 may be formed of alternatively stacking a plurality of high refractive index layers and a plurality of low refractive index layers, wherein a materials of the high refractive index layers may be selected from a group of silicon (Si), tantalum oxide ($Ta_2O_5$), titanium dioxide ($TiO_2$), titanium oxide ($Ti_3O_5$) or niobium pentaoxide ($Nb_2O_5$), and a material of the low refractive index layer may be selected from a group of silicon dioxide ($SiO_2$) or magnesium fluoride ($MgF_2$). Therefore, the alternatively stacked structure of the high refractive index and the low refractive index enables light emitted from the light emitting layer 420 to produce a constructive interference in the patterned distributed Bragg sub-reflection layer 442, thus enhancing the strength of reflection. In other words, the patterned distributed Bragg sub-reflection layers 442 has the light reflection and reflected light strengthen functions, providing the reflection layer 440 with better reflectivity. In the exemplary embodiment, an omni-directional reflection (ODR) layer is constituted of different refractive index dielectric stacked layers in addition with the metal reflection layer, and thus light emitted from the light emitting layer 420 from various angles may be highly reflected and enhanced, so as to enhance light emitting efficiency.

Because the semiconductor light emitting device 20 of FIG. 3 is similar to the exemplary embodiment of FIG. 1A, a top view of the semiconductor light emitting device 30 may actually be referred to the illustration shown in FIG. 1B. Similar to the exemplary embodiment of FIG. 1A, in the exemplary embodiment of FIG. 3, a patterned metal sub-reflection layer 444 includes a first metal reflective portion 444a and a second metal reflective portion 444b, and the first metal reflective portion 444a and the second metal reflective portion 444b are separately disposed with the spacing A in order to avoid conduction. In addition, a patterned distributed Bragg sub-reflection layer 442 has at least one first opening 510a and at least one second opening 510b, wherein the first metal contact 480 and the first metal reflective portion 444a penetrate the first opening 510a and electrically connect with the second type doped semiconductor layer 430, and the second metal contact 490 and the second metal reflective portion 444b penetrate the second opening 510b and electrically connect with the first type doped semiconductor layer 410.

In the exemplary embodiment, the patterned metal sub-reflection layer 444 and the patterned distributed Bragg sub-reflection layer 442 cover at least part of the second type doped semiconductor layer 430 and at least part of the first type doped semiconductor layer 410, wherein when observing from a viewing direction parallel to the light emitting layer 420, the patterned metal sub-reflection layer 444 and the patterned distributed Bragg sub-reflection layer 442 both cover at least part of the side surface 423, at least part of the side surface 433 and at least part of the side surface 412d, and cover at least part of the side surface 412c.

Figure 4A:
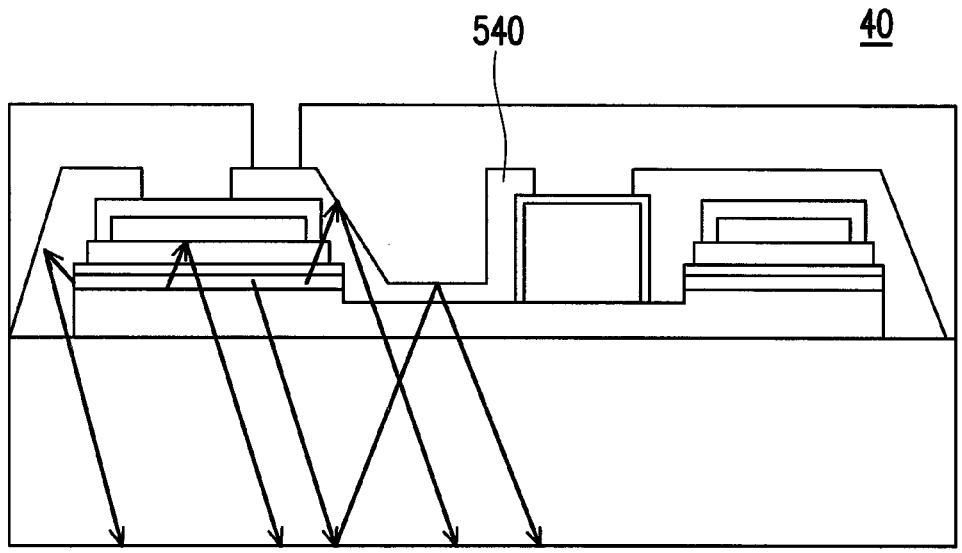
FIG. 4A is a cross-sectional view of a semiconductor light emitting device in accordance with an alternative exemplary embodiment.

FIG. 4A is a cross-sectional view of a semiconductor light emitting device in accordance with an alternative exemplary embodiment. The semiconductor light emitting device 40 of FIG. 4A is similar to the semiconductor light emitting device 30 of FIG. 3, except for the main difference that the semiconductor light emitting device 40 of FIG. 4A does not have the patterned metal sub-reflection layer 444 of FIG. 3. In the other wards, in the exemplary embodiment, a reflection layer 540 is a patterned distributed Bragg reflection layer. Since other structures in the semiconductor light emitting device 40 are similar to the exemplary embodiments of FIG. 3, detailed descriptions are not repeated herein.

Figure 4B:
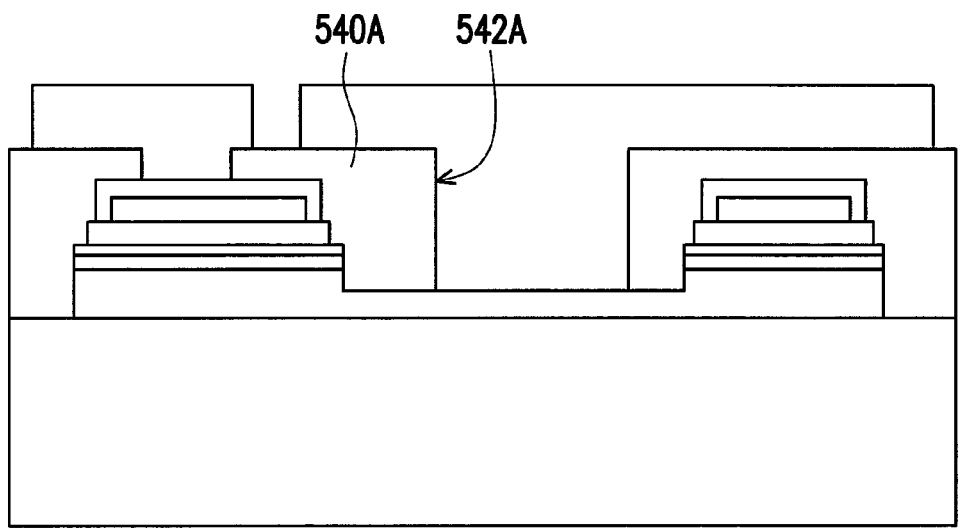
FIG. 4B is a cross-sectional view of a semiconductor light emitting device in accordance with an alternative exemplary embodiment.

FIG. 4B is a cross-sectional view of a semiconductor light emitting device in accordance with an alternative exemplary embodiment. The semiconductor light emitting device 40A of FIG. 4B is similar to the semiconductor light emitting device 40 of FIG. 4A, except for the main difference that, in the semiconductor light emitting device 40A of FIG. 4B, the patterned distributed Bragg reflection layer 540A on the depression portion 114 has a more vertical sidewall 542A. Since other structures in semiconductor light emitting device 40A are similar to the exemplary embodiment of FIG. 4A, detailed descriptions are not repeated herein.

Figure 5:
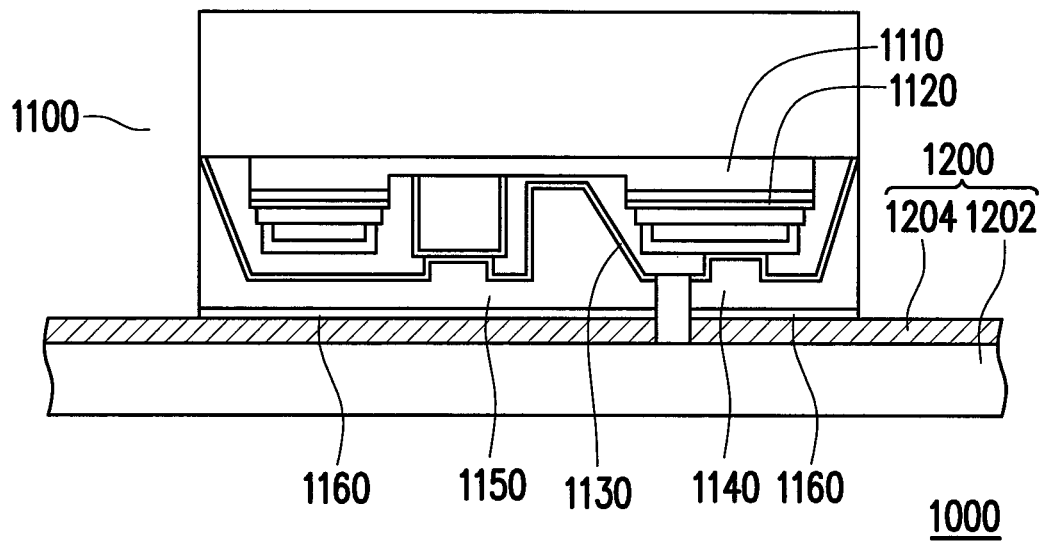
FIG. 5 is a schematic diagram of a flip chip package device in accordance with an exemplary embodiment.

FIG. 5 is a schematic diagram of a flip chip package device in accordance with an exemplary embodiment. Referring to FIG. 5, the flip chip package device 1000 in this embodiment includes a semiconductor light emitting device 1100 and a circuit substrate 1200. In the exemplary embodiment, the semiconductor light emitting device 1100 is, for example, the above-mentioned semiconductor light emitting device 10. However, in other exemplary embodiments, the semiconductor light emitting device 1100 may also be the semiconductor light emitting devices (e.g., the semiconductor light emitting device 20, 30, 40) of the above-mentioned exemplary embodiments (e.g., the exemplary embodiment of FIG. 1C, 2, 3, 4A, or 4B). In the exemplary embodiment, the flip chip package device 1000 may employ a flip-chip package method, namely, the first metal contact 1140 (e.g., the first metal contact 180 of FIG. 1A) and the second metal contact 1150 (e.g., the second metal contact 190 of FIG. 1A) are bonded to a circuit substrate 1200 respectively through two eutectic materials 1160 by flipping the semiconductor light emitting device 1100 up-side-down, so as to electrically connect the semiconductor light emitting device 1100 to the circuit substrate 1200. The method of jointing the first metal contact 1140 and the second metal contact 1150 with the circuit substrate 1200 may be eutectic bonding method. In detail, a material of the first metal contact 1140 and the second metal contact 1150 is, for example, gold, titanium, nickel, aluminium, chromium, platinum, or a combination thereof, stacked in a single structure or multi-layer stacked conductive structure, and the eutectic material 1160 may be gold-tin alloy (Au/Sn), tin-silver alloy, gold-germanium alloy, etc. In the exemplary embodiment, the circuit substrate 1200 may include a transparent substrate 1202 and a patterned conductive layer 1204 disposed on the transparent substrate 1202, wherein the transparent substrate 1202 may be a sapphire substrate. In the exemplary embodiment, the semiconductor light emitting device 1100 is jointed with the patterned conductive layer 1204 of the circuit substrate 1200 through the first metal contact 1140, the second metal contact 1150 and the eutectic material 1160, and then is electrically connected with an external circuit.

According to the above, in the semiconductor light emitting device and the flip chip package device according to the embodiments of the invention, since the reflection layer covers at least part of the second type doped semiconductor layer and at least part of the first type doped semiconductor layer, and when observing from a viewing direction parallel to the light emitting layer, the reflection layer covers at least part of the side surface of the light emitting layer and at least part of the side surface of the mesa portion, the reflection layer may reflect light emitted from the light emitting layer for enhancing the utilization of light emitted from the light emitting layer. In addition, the semiconductor light emitting device and the flip chip package device according to the embodiments of the invention have two reflection layers, and when observing from a viewing direction perpendicular to the light emitting layer, at least parts of the two reflection layers do not overlap. Consequently, the two reflection layers form a more complete reflection region for effectively reflecting light emitted from the light emitting layer, so as to enhance the utilization of light emitted from the light emitting layer.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor light emitting device comprising:
   a first type doped semiconductor layer having a mesa portion and a depression portion, wherein a thickness of the mesa portion is greater than a thickness of the depression portion;
   a second type doped semiconductor layer disposed on the mesa portion;
   a light emitting layer disposed between the first type doped semiconductor layer and the second type doped semiconductor layer, wherein the light emitting layer has a bottom surface facing towards the first type doped semiconductor layer;
   a first reflection layer disposed on the second type doped semiconductor layer; and
   a second reflection layer disposed on the first reflection layer and covering at least part of the first reflection layer, wherein the second reflection layer extends from above the mesa portion to nearing the depression portion, and downwards to a horizontal position lower than or at the same height with the bottom surface, and wherein a reflectance of the second reflection layer is greater than 98%;
   wherein when observing from the viewing direction perpendicular to the light emitting layer, at least part of the second reflection layer and the first reflection layer do not overlap.

2. The semiconductor light emitting device as recited in claim 1, wherein the second reflection layer is a patterned metal reflection layer.

3. The semiconductor light emitting device as recited in claim 2, wherein the patterned metal reflection layer comprises a first metal reflective portion and a second metal reflective portion respectively electrically connected to the first type doped semiconductor layer and the second type doped semiconductor layer, wherein the first metal reflective portion and the second metal reflective portion are separately disposed from each other.

4. The semiconductor light emitting device as recited in claim 3 further comprising an insulating layer disposed between the second reflection layer and the first reflection layer, wherein the insulating layer has at least one first opening and at least one second opening, the first metal reflective portion covers the first opening and electrically connects with the first type doped semiconductor layer, and the second metal reflective portion covers the second opening and electrically connects with the second type doped semiconductor layer.

5. The semiconductor light emitting device as recited in claim 1, wherein the mesa portion has:
   a first surface facing away from the light emitting layer;
   a second surface opposite to the first surface and facing towards the light emitting layer;
   a first side surface connecting the second surface with the depression portion; and
   a second side surface connecting the first surface with the second surface, wherein observing from a viewing direction parallel to the light emitting layer, the second reflection layer further covers at least part of the first side surface and at least part of the second side surface.

6. The semiconductor light emitting device as recited in claim 1 further comprising an ohmic contact layer disposed between the second type doped semiconductor layer and the first reflection layer.

7. The semiconductor light emitting device as recited in claim 6 further comprising a barrier layer disposed on the first reflection layer and covering the ohmic contact layer.

8. The semiconductor light emitting device as recited in claim 1, wherein the second reflection layer is a patterned distributed Bragg reflection layer.

9. The semiconductor light emitting device as recited in claim 8, wherein the patterned distributed Bragg reflection layer has at least one first opening and at least one second opening; and the semiconductor light emitting device further comprises:
   a first metal contact disposed on the patterned distributed Bragg reflection layer and electrically connected to the first type doped semiconductor layer through the first opening; and
   a second metal contact disposed on the patterned distributed Bragg reflection layer and electrically connected to the second type doped semiconductor layer through the second opening.

10. A flip chip package device comprising:
a circuit substrate; and
a semiconductor light emitting device flipped over on and electrically connected with the circuit substrate, the semiconductor light emitting device comprising:
  a first type doped semiconductor layer having a mesa portion and a depression portion, wherein a thickness of the mesa portion is greater than a thickness of the depression portion;
  a second type doped semiconductor layer disposed on the mesa portion;
  a light emitting layer disposed between the first type doped semiconductor layer and the second type doped semiconductor layer, wherein the light emitting layer has a bottom surface facing towards the first type doped semiconductor layer;
  a first reflection layer disposed on the second type doped semiconductor layer;
  a second reflection layer disposed on the first reflection layer, wherein the second reflection layer extends from above the mesa portion to nearing the depression portion, and downwards to a horizontal position lower than or at the same height with the bottom surface, and wherein a reflectance of the second reflection layer is greater than 98%;
  a first metal contact disposed on the second reflection layer and electrically connected to the first type doped semiconductor layer; and
  a second metal contact disposed on the second reflection layer and electrically connected to the second type doped semiconductor layer;
wherein when observing from a viewing direction perpendicular to the light emitting layer, at least part of the second reflection layer and the first reflection layer do not overlap.

11. The flip chip package device as recited in claim 10, wherein the semiconductor light emitting device is electrically connected with the circuit substrate through a eutectic material.

12. The flip chip package device as recited in claim 10, wherein the circuit substrate comprises:
  a transparent substrate and a patterned conductive layer, wherein the patterned conductive layer is disposed on a surface of the transparent substrate.

13. The flip chip package device as recited in claim 12, wherein the transparent substrate is a sapphire substrate.

14. A semiconductor light emitting chip comprising:
  a first type doped semiconductor layer having a mesa portion and a depression portion, wherein a thickness of the mesa portion is greater than a thickness of the depression portion;
  a light emitting layer disposed on the mesa portion, the light emitting layer having a first surface, a second surface opposite to the first surface and a first side surface connecting the first surface with the second surface, wherein the first surface faces towards the first type doped semiconductor layer, and the second surface faces away from the first type doped semiconductor layer;
  a second type doped semiconductor layer disposed on the light emitting layer, the second type doped semiconductor layer having a third surface, a fourth surface opposite to the third surface and a second side surface connecting the third surface and the fourth surface, wherein the third surface faces towards the light emitting layer, the fourth surface faces away from the light emitting layer; and
  a reflection layer covering at least part of the second type doped semiconductor layer and at least part of the first type doped semiconductor layer, wherein the reflection layer extends from above the mesa portion to nearing the depression portion, and downwards to a horizontal position lower than or at the same height with the first surface, and wherein when observing from a viewing direction parallel to the light emitting layer, the reflection layer covers at least part of the first side surface and at least part of the second side surface, and a reflectance of the reflection layer is greater than 98%.

* * * * *